United States Patent [19]

Rose et al.

[11] Patent Number: 5,336,885
[45] Date of Patent: Aug. 9, 1994

[54] ELECTRON BEAM APPARATUS

[75] Inventors: Harald Rose, Darmstadt; Ralf Degenhardt, Offenbach, both of Fed. Rep. of Germany; Karel D. Van der Mast, Eindhoven, Netherlands

[73] Assignee: U.S. Philips Corporation, New York, N.Y.

[21] Appl. No.: 963,647

[22] Filed: Oct. 20, 1992

[30] Foreign Application Priority Data

Oct. 24, 1991 [EP] European Pat. Off. ........ 91202753.9

[51] Int. Cl.⁵ .................................. H01J 37/295
[52] U.S. Cl. ........................... 250/305; 250/311
[58] Field of Search ........................ 250/305, 311

[56] References Cited

U.S. PATENT DOCUMENTS

| | | | |
|---|---|---|---|
| 3,863,069 | 1/1975 | Shirota | 250/305 |
| 4,740,704 | 4/1988 | Rose et al. | 250/396 ML |
| 4,812,652 | 3/1989 | Egle et al. | 250/311 |
| 5,097,126 | 3/1992 | Krivanek | 250/305 |
| 5,126,565 | 6/1992 | Rose et al. | 250/305 |
| 5,177,361 | 1/1993 | Krahl et al. | 250/305 |

OTHER PUBLICATIONS

Degenhardt and Rose, "*A compact abberation-free imaging filter with inside energy selection*", Nuclear Instrumentation and Methods in Physics Research, A298, 1990, No. 1, pp. 171–178.

*Primary Examiner*—Bruce C. Anderson
*Attorney, Agent, or Firm*—Leroy Eason

[57] ABSTRACT

An electron beam apparatus is provided with an energy selective device which enables spectrometric measurements together with imaging. The energy selective device has its main electron beam trajectory in a plane outside the optical axis of the electron beam apparatus, thereby substantially reducing the overall length of the apparatus. Preferably the energy selective device has double symmetry such that the energy dispersion has a maximum value in a central plane of symmetry where a selective slit can be introduced. Full symmetry facilitates full compensation of optical aberrations in the device. Adding quadruples in a second plane of symmetry enables imaging of spectra at a location outside the device.

18 Claims, 4 Drawing Sheets

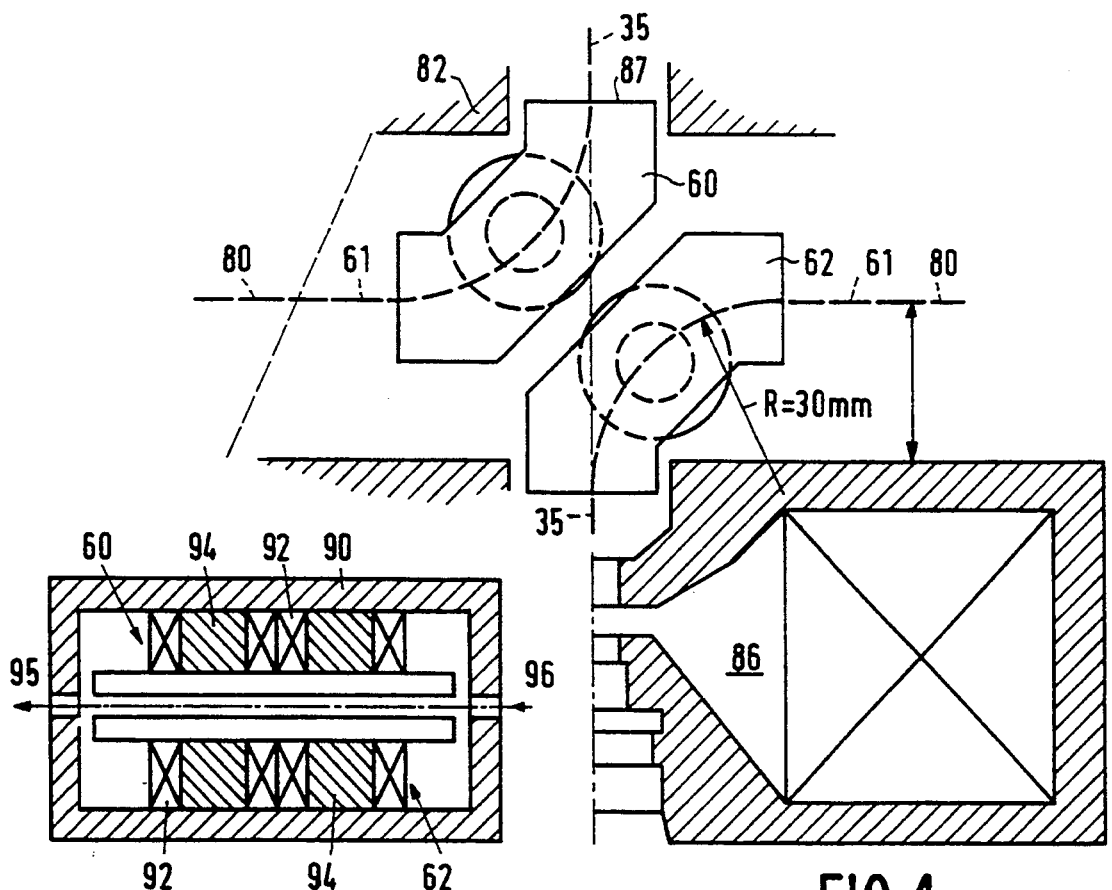
FIG. 4a
FIG. 4b
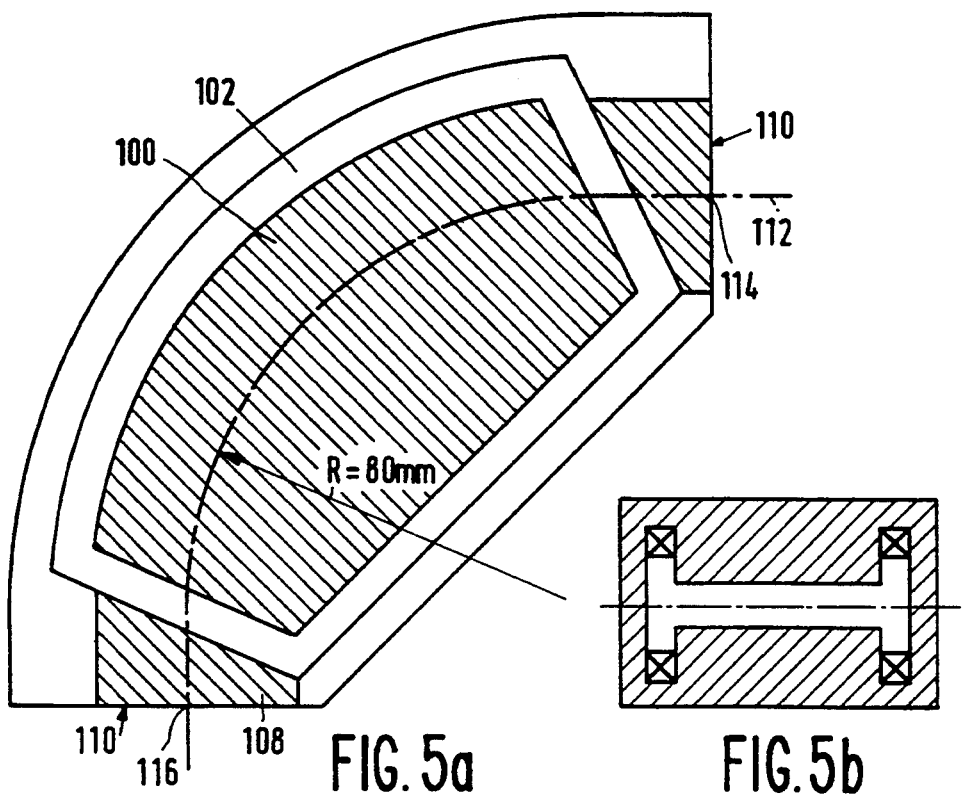
FIG. 5a
FIG. 5b

ELECTRON BEAM APPARATUS

BACKGROUND OF THE INVENTION

1. Field of the Invention

The invention relates to an electron beam apparatus provided with an electron source, an electron optical system registered about an optical axis of the apparatus, and an energy selective device for spectrometric measurement. The invention also relates to an energy selective device for use in such an apparatus.

2. Description of the Related Art

An apparatus of this kind is known from U.S. Pat. No. 4,812,652 issued Mar. 12, 1989. It is an object of the known apparatus to combine specimen imaging and local sensitive spectrometric measurements on a specimen in a transmission electron microscope. Thus spectrometric measurements should not hamper imaging action of the microscope, and vice versa. The energy dispersive device used in the known apparatus comprises (see FIG. 2 of said patent) a first beam bending prism, a beam reflector and a second beam bending prism. An electrostatic mirror is necessary in order to bring the electrom beam back in line with the optical axis of the apparatus after leaving the dispersive device. The device has as a drawback a limited isochromatic field of the view, which limits the dimensions of a specimen to be investigated per specimen position. A further drawback of the known apparatus is that due to the electrostatic mirror it can only be used with restricted high voltage values and that it is rather sensitive to external field strength disturbances.

SUMMARY OF THE INVENTION

It is an object of the invention to provide an energy selective spectrometric measuring device in which the above cited restrictions are avoided without introducing additional electron optical aberrations in the imaging of the electron beam apparatus, and in which annoying sensitivity to external influences is reduced and high voltages within the normal range for transmission electron microscopes can be used.

To this end an electron beam apparatus set forth in the preamble according to the invention is characterized in that a main electron beam path of the energy selective device is registered in a plane not including the optical axis of the apparatus. Due to the fact that the optical axis of the energy selective device is according to the invention located in a plane substantially transverse to the optical axis of the apparatus, an extended beam travelling path is available for control of beam modulation and dispersive action without influencing the total length of the appartus. Thus the dispersive device can be optimized for imaging and dispersion without any length restrictions. This permits appropriate electron optical elements to be introduced in the device.

In a preferred embodiment, the energy selective device is enclosed between a first beam deflecting system for directing the beam outside the optical axis and a second beam deflecting system for redirecting the beam in line with the optical axis. Thus the total length of the apparatus is extended by a value corresponding to two times the deflecting radius of a first and a last beam deflecting device, leaving an arbitrary length between these two beam deflectors for optical treatment of the beam. In particular, the first beam deflecting system comprises a first substantially 90° deflecting element for directing the beam in a direction substantially transverse to the optical axis and a second substantially 90° deflecting element for directing the beam in a direction outside the optical axis enclosing plane, the second beam deflecting system comprising a third and a fourth substantially 90° beam deflecting element for redirecting the beam in line with the optical axis. Thus a high degree of freedom for orientation of the plane of the beam path in the energy selective device is introduced. The orientation of this plane can now be registered in conformity attractive with an apparatus design and construction. An advisable solution can be to have this plane parallel with the optical axis, resulting in an energy selective system mounted fully against the column of the electron beam apparatus. In a further embodiment all or part of the beam deflecting elements form part of the energy selective device per se. Beam deflecting elements can relatively easily be adapted to fulfill a double electron optical function in the energy selective system according to the invention. This embodiment reduces the total number of elements for the energy selective system.

In a preferred embodiment the energy selective device is enclosed between two substantially 90° beam deflecting elements, a first element directing the beam in a direction substantially transverse to the optical axis of the apparatus and a second element directing the beam back in line with the optical axis of the apparatus. Using two preferably similar beam directing elements permits a high degree of symmetry in the system and offers the possibility to correct the beam on both sides of the dispersive device per se.

In a further preferred embodiment the energy selective device comprises two substantially 180° beam bending systems constituting an energy dispersion in an electron beam to be investigated in a central symmetry plane between said two systems. Introducing two preferably similar 180° beam bending systems enables introducing full symmetry of the device with respect to the central symmetry plane coinciding with a plane of optimal dispersion. The latter fact enables to correct and compensate, with the help of the second beam bending system, for all the beam deviations of the first beam bending system.

Preferably each 180° bending systems comprises two 90° bending elements constituting a second symmetry plane substantially perpendicular to the central symmetry plane. This introduces possibilities for further beam correcting in said second symmetry plane. In order to give the 90° beam bending elements a double focusing action they preferably comprise flat magnetic segments with tilted entrance and/or exit surfaces, edge shaped magnetic segments and/or flat magnetic segments provided with current windings to introduce or control double focusing action.

In a further embodiment a quadrupole lens is introduced on both sides of the main symmetry plane enlarging the dispersive action of the energy selective device in the main symmetry plane and subsequently compensating said enlargement. Preferably such quadrupole lenses are introduced in the second symmetry plane and connected in series for equalizing their action on the electron beam.

In a further embodiment the deflecting elements enclosing the dispersive device provide a rotary symmetrical focusing action with respect to beam axis of the dispersive device. This avoids the introduction of any deviation in the electron beam in the dispersive device in this respect. Preferably the beam deflecting elements provide rotational symmetric focusing around the curved axis of the device. The beam deflecting elements are preferably equipped similar to the 90° beam bending elements for introducing dual focusing.

In a preferred embodiment the two beam deflecting elements enclosing the dispersive device act together such that an achromatic plane for an entrance beam deflecting element and an achromatic plane of the exit beam deflecting element constitute mutually conjugated imaging planes.

Preferably an energy selecting diaphragm system is located in the central symmetry plane of the dispersive element. This enables maintenance of full symmetry in the spectrometer and so permitting full compensation of electron beam deviations such that the imaging action of the apparatus is not adversely affected. Alternatively the energy selecting diaphragm can be located about the beam axis of the apparatus after the dispersive device. This location often can easily be established but full symmetry is lost.

In a further embodiment multipole elements are added to the dispersive device to correct for second order aberrations in the energy selective device. Such elements can also be introduced to correct for beam distortion in the electron beam. These correctors are preferably situated between the first and the second 90° beam bending elements and between the third and the fourth 90° bending elements. A further corrector can be placed before the first and after the last sector—eventually about the optical axis of the apparatus before and after the selective system as a whole.

In a further embodiment a beam adapting lens is introduced in advance of the energy dispersive system in order to optimize relevant electron beam parameters to the dispersive device.

In a further embodiment a relatively strong lens is added subsequent to the energy dispersive device for imaging action to the electron beam. This lens is preferably constituted as a doublet in order to enlarge beam control possibilities such as avoiding beam rotation.

In a preferred embodiment the energy dispersive device is registered subsequent to an objective lens, a diffraction lens and an intermediate lens. In such an apparatus the adapting lens can be introduced between said three lenses and the device.

Preferably an apparatus according to the invention is provided with a slow scan CCD camera for read out signals. Such a camera is preferably placed in an image plane after the dispersive device.

In the measuring modes described above, an electron energy loss spectrum is preferably located at the central symmetry plane of the system. Due to the symmetry conditions an energy spectrum cannot arbitrary be formed outside the energy selective device. It is however desirable to have the possibility of imaging the central symmetry plane containing an energy spectrum on the microscope imaging screen or somewhere else in the apparatus where it can be detected with, for example, a CCD camera or the like. This would enable an accurate positioning of an energy selecting slit in the spectrum for collecting spectral information from the electron beam. In order to obtain this the energy dispersive effect after the symmetry plane should be minimized. This is realized in a preferred embodiment by creating an additional cross-over in the energy dispersive plane of the energy dispersive system between a third and a fourth beam bending sector. This has the effect that the effective dispersion of the third and the fourth sector taken together is about zero and thus the dispersion resulting in the central symmetry plane remains unaffected. Preferably this is realized by applying two or three additional quadrupoles between the third and the fourth bending sector, or by introducing a quadrupole effect in the sector fields per se by additional coils on the sector pole piece surfaces as described, or possibly by structural means. In a preferred embodiment it is possible to switch between the imaging mode and spectrometer mode by changing the excitation of the above-mentioned quadrupoles.

BRIEF DESCRIPTION OF THE DRAWINGS

Some embodiments in accordance with the invention will be described hereinafter with reference to the accompanying drawings wherein:

FIGS. 4a and 4b show a pair of 90° beam deflecting devices incorporated in a lens system of an electron microscope, FIGS. 5a and 5b shows an example of the geometry of a 90° beam bending magnet for an energy selective system.

DESCRIPTION OF THE PREFERRED EMBODIMENTS

Figure 1:
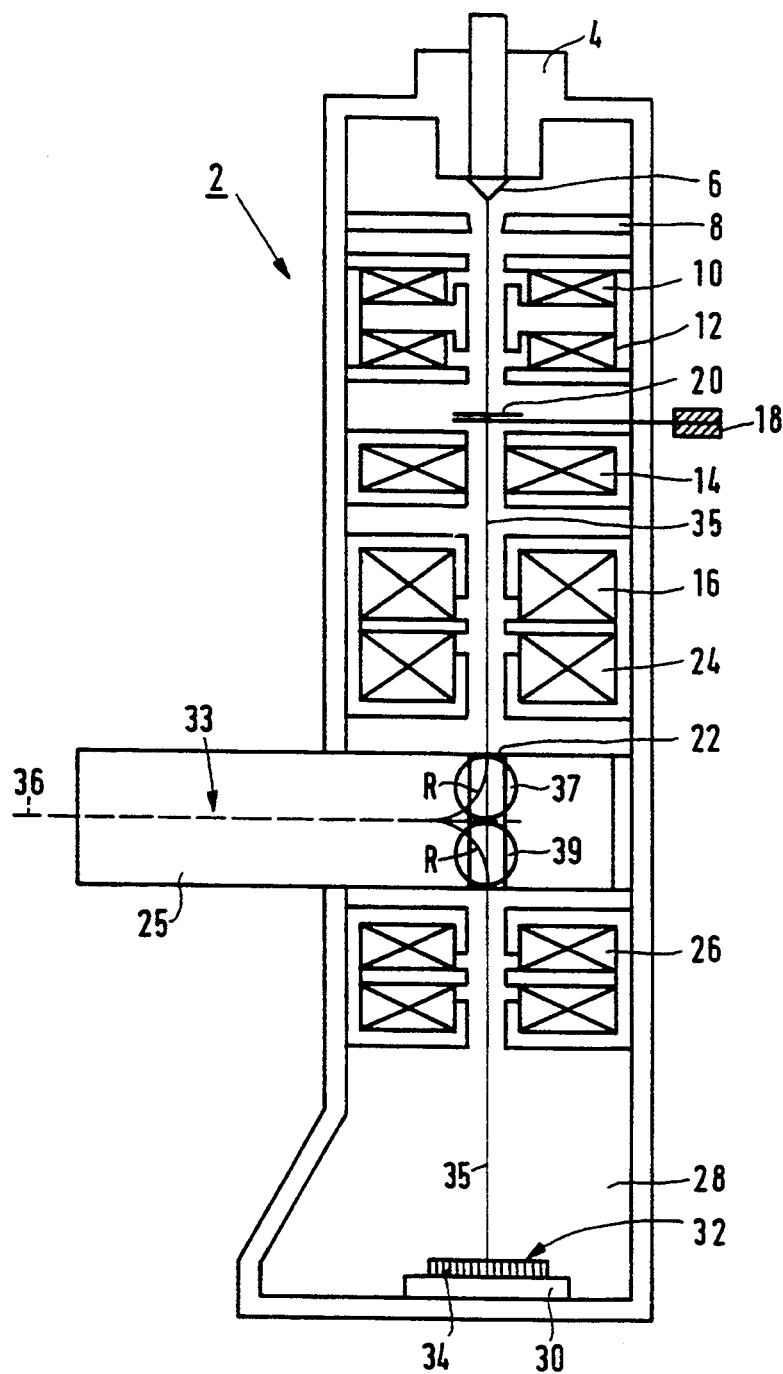
FIG. 1 shows an electron microscope with an energy selective spectrometric measuring system in accordance with the invention.

A transmission electron microscope 2 as shown in FIG. 1 comprises an electron source 4 with a cathode 6 and an anode 8, a condenser lens system 10, an objective lens system 12, a diffraction lens system 14 and an intermediate lens 16. For imaging an object 20 supported by an object carrier 18 onto an entrance plane 22 of an energy selective filter 25 according to the invention, an adoption lens 24 is preferably added. Subsequent to the filter 25 a projection lens system 26 and an imaging space 28 with an image screen 30 is provided. The projector lens system 26 comprises two lenses in order to facilitate magnification variation of a spectrum to be detected by, for example, a CCD pick-up system 32 without rotation thereof, thus maintaining for all magnifications the dispersion direction perpendicular to imaging pixels 34 of the CCD system. If a main beam path 33 of the filter 25 is registered in a plane 36, which in the embodiment shown is perpendicular to the optical axis 35 of the microscope, it can easily be seen that a total additional column length of 2R is necessary for the filter. R being the deflecting radius of an entrance beam deflecting system 37 and of an exit beam deflecting system 39 which are incorporated for directing the electron beam into the beam path plane 36 of the filter and back into the optical axis 35 after passing through the filter.

Figure 2:
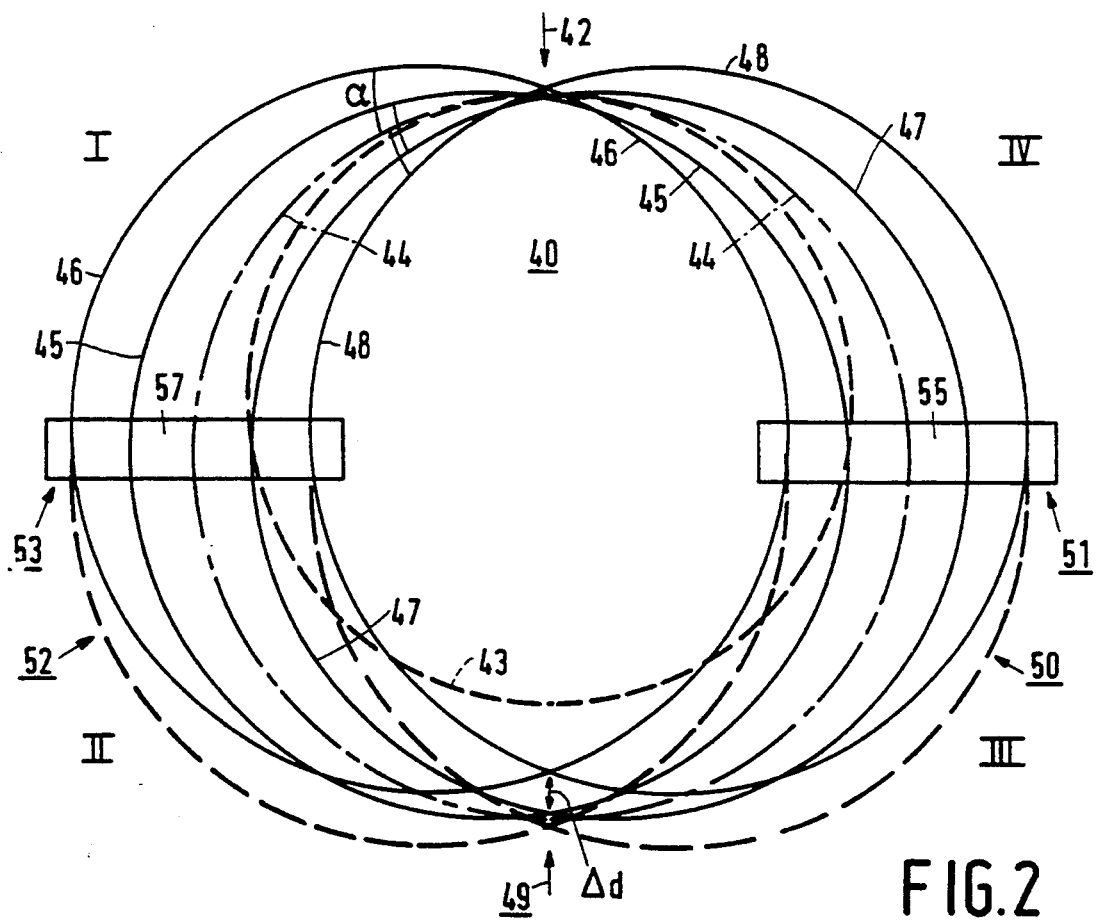
FIG. 2 shows an example of fundamental beam trajectories in the energy selective filter in FIG. 1.

Optical principles of an energy selective filter 40 per se may be elucidated from relevant electron trajectories in a homogenous magnetic field as shown in FIG. 2. Selecting a certain point 42 as an entrance and exit point for the filter, being in use a point on the optical axis of the microscope, all trajectories through point 42 registered in a plane perpendicular to the field lines are perfect circles. A certain circle 44 can be chosen as a (curved) optical axis of the filter. From circle shaped trajectories 46, 48 and 45, 47 respectively of electrons departing from point 42 under slightly varying negative and positive angles α respectively but all having the same energy, thus the same radius of curvature, the focusing properties of the filter can be seen especially after traversing 180 and 360 degrees respectively. Evident is a second order aberration Δd in the region 49 after 180 degrees and a total absence of any aberration after 360 degrees. That is to say all trajectories return to point 42 again. A second half 52 of the filter fully compensator the second order aberrations of the first half 50 of the filter. After 180 degrees the deviation Δd from the central trajectory 44 is proportional to $α^2$ so that a positive and a negative angle deviation both have a similarly directed aberration.

For energy selection a cross-over of the electron beam must be focused at the point 42. An electron beam 43 of slightly less energy is represented as a dotted line. Circles with that same energy and thus the same radius but again at different angles, will show the same behaviour as the previous set of circles. What can be seen is, that after 360 degrees no aberration remains. A complete achromatic and second order aberration free, one to one imaging system, has been realized. When used in an electron microscope this system will not influence any optical behaviour of the electron beam, that being true for every optical situation and not only for the case when the cross-over is located at point 42. For selecting a certain electron energy range a slit can be located at point 49. It can be seen that the effects of second order aberrations is as follows. A small slit at point 49 will limit the field of view for a given (narrow) energy range and for different values of α the selected energy range is different, resulting in aniochromatic imaging. These two aberrations can be corrected by placing at locations 51 and 53, thus after 90° and 270° bending respectively optical elements 55 and 57 having second order deflection effects in the plane of the filter around the central trajectory 44. These optical elements are preferably sextupoles of which the aberration in other directions can be neglected because energy selection is performed with a slit and not with another shaped diaphragm. The second sextupole 57 at 53 compensates completely the effect of the first one, so the two sextupoles together do not have any effect on the image quality of the entire filter circle. Such a filter thus enables to avoid second order aberrations, has no chromatic imaging aberrations, and in the energy selecting plane at 49 there will be no second order aberrations causing anisochromacy or field of view limitation.

Figure 3:
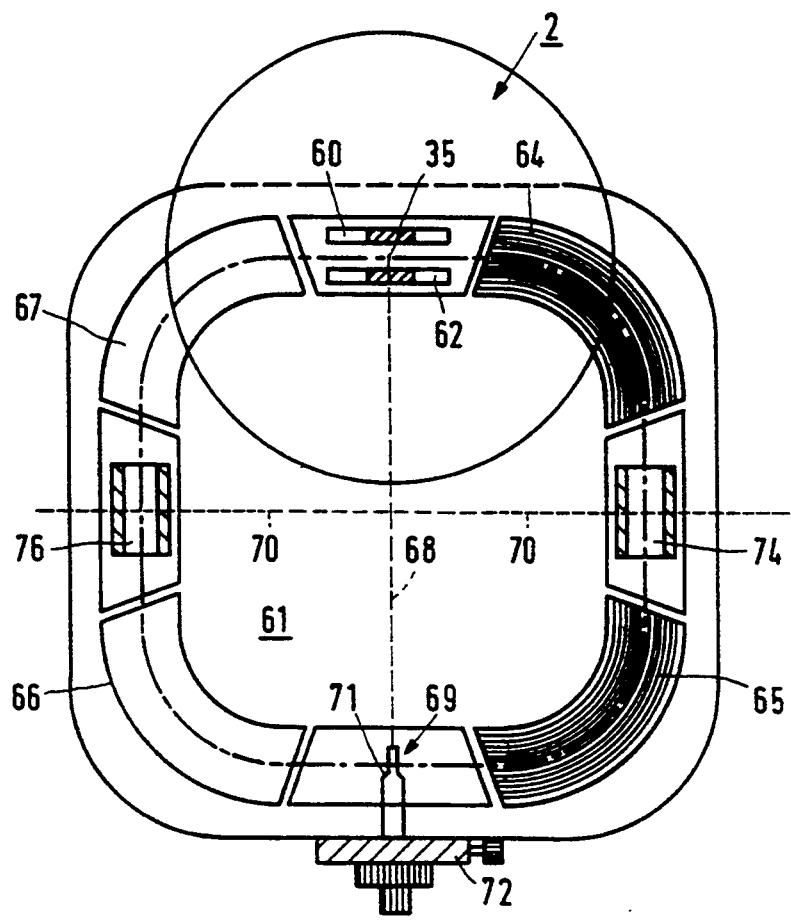
FIG. 3 shows an example of a double symmetrical energy selective system.

In FIG. 3 an embodiment of an energy selective filter based upon the above principles is shown. Such a filter comprises a beam deflecting element 60 for deflecting the electron beam out of the optical axis 35. A second beam deflecting element 62 deflects the electron beam after passing through the filter back in line with the optical axis. In the Figure these two elements are on top of one another and extend on both sides of the plane 61 of the filter, here the plane of drawing. The filter further comprises four beam bending elements 64, 65, 66 and 67. The four elements have a central plane of symmetry 68 and also a second plane of symmetry 70. The central plane of symmetry 68 encloses the optical axis 35 and a dispersion plane 69 located in the region 49 indicated in FIG. 2. In the dispersion plane 69 an energy selecting slit 71 with a control system 72 is introduced. Dispersion is in the plane of drawing here, the energy discriminating limitations of the slit being directed perpendicular to the plane of drawing. Between the beam bending elements 64 and 65 there is a sextupole system 74 and between beam bending elements 66 and 67 there is a sextupole system 76. The four beam bending elements, all being substantially 90° bending elements constitute a double symmetrical system facilitating the introduction of beam correcting elements without adverse affects on the electron beam. A more fundamental elucidation of the optical principles and advances of a double symmetry energy selective filter is given in an article of Rose and Degenhardt in Nuclear Instrumentation and Methods in Physics Research A 298 (1990) No. 1 pages 15-38. With the full circle design as shown in FIG. 3 the two symmetry plane conditions can easily be fulfilled.

To enter the beam into the filter, and to direct it, into the microscope axis again two 90 degree deflectors are again needed. From these deflectors preferably no other first order optical effects are to be required and so they should be rotational symmetric, since the filter imaging properties have been made entirely rotational symmetric along its stretched axis. An element which can provide this function is a magnetic sector with conical pole pieces. These elements have rotational symmetry in terms of focusing action, but do suffer from second order aberrations and energy dispersion. If same symmetry rules are applied in the filter these can be completely cancelled. This can be partially realized by having the entrance and exit cross-over exactly in the centre of these deflectors. As the deflectors are placed at point 49, where the cross-over should be located for energy selection, this condition is about fulfilled. Real trajectory calculations show that the cross-over is situated a little bit off centre. Further, the dimensions of the deflectors can be chosen such that their focal planes outside the system coincide with the microscope image plane, leading to symmetry of the imaging principal rays. This guarantees that the slight asymmetry of the cross-over positions in the deflectors generates negligible transverse chromatic aberration in the image.

In FIG. 4a a pair of 90° beam deflectors 60 and 62 are given in relationship to parts of the electron beam apparatus. The first deflector 60 deflects an electron beam out of the optical axis 35 of the electron beam apparatus and a second deflector 62 deflects it back into the axis 35. Between the two deflectors the beam runs in the filter plane 61 through the line 80 and perpendicular to the plane of drawing, thus perpendicular to the axis 35. The first deflector is mounted near to a lens system 82 of the electron beam apparatus, preferably an adopting lens to be used for an optimized adaptation of the electron beam geometry in a filter entrance plane 84. The bending device 62 is mounted near to a subsequent optical lens system 86 of the electron beam apparatus, preferably a projector lens. The beam is deflected in the deflecting devices with a radius R of for example 30 mm, thus the optical thickness of the filter measured in the direction of the axis 35 is at least 2R=6 cm but need not to be much more than that. Where possible the deflectors are partly located inside said lens system and thus the geometrical thickness of the filter can even be less than 6 cm.

FIG. 4b show the geometry of the beam deflecting system of FIG. 4a in top view, that is to say looking in the direction of the optical axis 35 towards the deflecting system. The system has a magnetic joke 90, a first deflector 60, and at a lower level a second deflector 61. Both deflectors are provided with electro-magnetic coils 92 and magnetic short shunting elements 94. The electron beam enters at 35, is deflected in a direction 95 in the filter plane, 61 running round in the filter plane and reenters at point 96 to be bended back into the optical axis direction again.

In FIG. 5a an example of a beam bending element of a double symmetrical energy selective filter is given and shows a magnetic pole face 100 with a recess 102 in which as shown in FIG. 5b a coil 104 is mounted, and on a lower level a mirror plate 108. End faces 110 of the mirror plate enclose an angle of 90°. An electron beam 112 enters the bending device at 114 and leaves the device at 116 being bended over substantially 90°. A symmetrical filter may be built up with four of these beam bending devices as shown in FIG. 3. In order to introduce double focusing in the beam bending devices the end faces 114 and 116 can be oblique oriented with respect to the filter plane as the electron beam trajectory, the pole faces facing the beam trajectory can be tilted in the direction of the trajectory or pole pieces can be provided with current conductors introducing a focusing magnetic field in a direction perpendicular to the pole faces facing the electron beam path.

Figure 6:
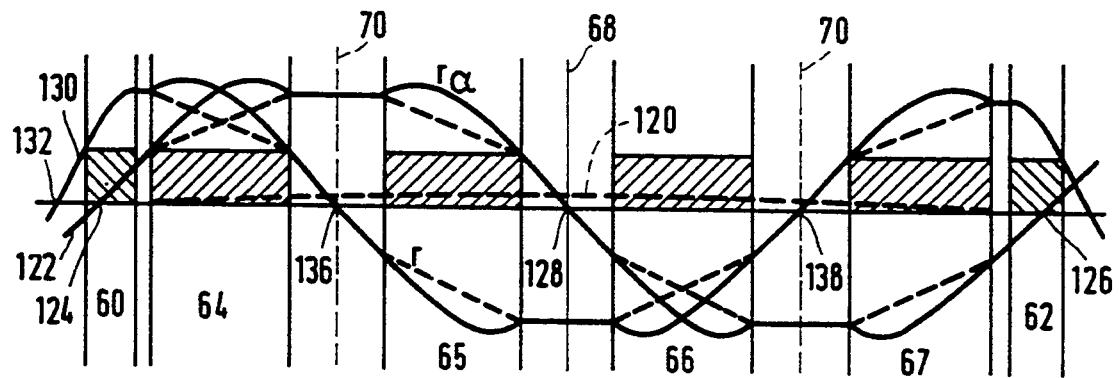
FIG. 6 shows principal beam trajectories in an energy selective filter system in the imaging mode.

FIG. 6 shows principal electron trajectories within the filter in the imaging mode, and shows paths through an entrance beam deflecting device 60, a first beam bending element 64, a second beam bending element 65, a third beam bending element 66, a fourth beam bending element 67, and a second beam deflecting element 61. Between the elements 65 and 66 a central symmetry plane 68 is located, and between elements 64, 65 and 66, 57 a second symmetry plane 70 is located. The line 120 shows that the dispersion of the filter is largest at the central symmetry plane 68. In the second symmetry plane hexapoles can be introduced as already shown in FIG. 3. A first electron trajectory 122 runs through a cross-over 124 as the image point for the system and leaves the filter system through an image 126 of the cross-over 124, giving also a cross-over point 128 in the central symmetry plane 68. A second electron trajectory 130 running through an entrance image point 132 leaves the system through an exit image point 134, giving also image points in the second symmetry plane positions 136 and 138.

Figure 7:
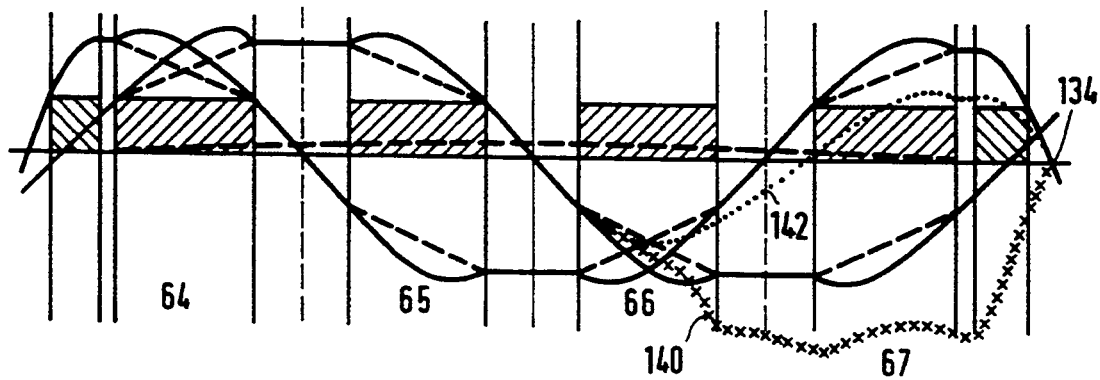
FIG. 7 shows principal beam trajectories in an energy selective filter system in the spectroscopic mode.

FIG. 7 shows principal electron trajectories in the spectrometric mode. the filter has the same elements as in FIG. 6 but the sectors 66 and 67 are provided with quadrupole systems as such that its image cross-over is shifted to outside the system indicated by the cross line 140. The trajectory 130 of FIG. 6 is changed into the dotted trajectory 142 by the two quadrupoles, such that the axis crossing 138 is avoided and the electron trajectory leaves the system also through the imaging point 134 from which the energy spectrum can be picked up for further examination.

As mentioned above the trajectory plane of the filter need not necessarily be located perpendicular to the optical axis but any other plane can be chosen with adapted beam deflecting elements. A preferred embodiment is to have the plane outside the axis but parallel therewith. If more than two beam deflecting elements are needed at least part thereof can act as beam bending devices.

We claim:

1. Electron beam apparatus comprising:
   an electron source for producing an electron beam;
   an electro-optical system for directing said beam along an optical apparatus of the apparatus; and
   an energy selective filter having an entrance plane at which the electron beam is received, said filter comprising a first deflecting system for directing the beam away from the optical axis and a second deflecting system for re-directing the beam in line with the optical axis, the two deflecting systems causing electrons of different energies in the beam to traverse different substantially circular paths in a plane which passes through said filter but which does not include the optical axis, the energy dispersed beam emerging from an exit plane of said filter.

2. Electron beam apparatus as claimed in claim 1, characterized in that the first beam deflecting system comprises a first substantially 90° deflecting element for deflecting the beam in a direction substantially transverse to the optical axis and a second substantially 90° deflecting element for deflecting the beam in a direction in a plane outside the optical axis, the second beam deflecting system comprising third and fourth substantially 90° beam deflecting elements for redirecting the beam in line with the optical axis.

3. Electron beam apparatus as claimed in claim 2, characterized in that said filter has a main beam path in a plane which is parallel with the optical axis.

4. Electron beam apparatus as claimed in claim 2 characterized in that beam deflecting elements of the energy selective filter comprise flat magnetic segments provided with tilted entrance and/or exit surfaces for introducing dual focusing action.

5. Electron beam apparatus as claimed in claim 4 characterized in that said magnetic segments the beam deflecting elements of the energy selective filter are provided with current windings for introducing or trimming dual focusing action.

6. Electron beam apparatus as claimed in claim 2 characterized in that beam deflecting elements of the energy selective filter comprise edge shaped magnetic segments for introducing dual focusing action.

7. Electron beam apparatus as claimed in claim 1, characterized in that the first deflecting system deflects the beam in a direction substantially transverse to the optical axis.

8. Electron beam apparatus as claimed in claim 1, characterized in that said plane is a central symmetry plane intermediate between said first and second deflecting systems of the energy selective filter.

9. Electron beam apparatus as claimed in claim 8 characterized in that on both sides of a central symmetry plane of the energy selective filter, in which energy dispersion is generated, a quadrupole lens is introduced for magnifying and subsequently demagnifying energy dispersion.

10. Electron beam apparatus as claimed in claim 8 characterized in that an energy selecting diaphragm system is located in a central symmetry plane of the energy selective filter.

11. Electron beam apparatus as claimed in claim 8, characterized in that the first beam deflecting system comprises first and second substantially 90° beam deflecting elements on one side of said central symmetry plane and the second beam deflecting system comprises third and fourth substantially 90° beam deflecting elements on the opposite side of said central symmetry plane.

12. Electron beam apparatus as claimed in claim 11 characterized in that the four beam deflecting elements constitute a second symmetry plane transverse to the central symmetry plane.

13. Electron beam apparatus as claimed in claim 11 characterized in that beam deflecting elements provide a rotary symmetrical focusing action with respect to an axis of the dispersive device.

14. Electron beam apparatus as claimed in claim 11 characterized in that the beam deflecting elements provide a dual focusing action.

15. Electron beam apparatus as claimed in claim 11, characterized in that the energy selective filter further comprises an energy dispersive element which acts with the beam deflecting elements such that an achromatic plane of the first and second beam deflecting elements and an achromatic imaging plane of the third and fourth beam deflecting elements constitute mutually conjugated planes.

16. Electron beam apparatus as claimed in claim 8 further comprising quadruples added to a second half of the energy selective filter subsequent to said central symmetry plane thereof to establish spectrometric action of the energy selective filter.

17. Electron beam apparatus as claimed in claim 1 further comprising hexapole lenses to correct for second order aberrations in plane said intermediate of said filter, in order to increase the isochromatic fields of view.

18. Electron beam apparatus as claimed in claim 1 further comprising multipole lenses added to the energy dispersive filter for correcting distortion of the electron beam.

* * * * *